(12) United States Patent
Lee et al.

(10) Patent No.: US 10,157,963 B1
(45) Date of Patent: Dec. 18, 2018

(54) SEMICONDUCTOR DEVICE WITH MEMORY STRUCTURE

(71) Applicant: MACRONIX INTERNATIONAL CO., LTD., Hsinchu (TW)

(72) Inventors: Dai-Ying Lee, Hsinchu County (TW); Erh-Kun Lai, Taichung (TW); Feng-Min Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/712,474

(22) Filed: Sep. 22, 2017

(51) Int. Cl.
*H01L 27/24* (2006.01)
*H01L 45/00* (2006.01)

(52) U.S. Cl.
CPC ........ *H01L 27/2436* (2013.01); *H01L 45/122* (2013.01); *H01L 45/1253* (2013.01); *H01L 45/146* (2013.01); *H01L 45/1675* (2013.01)

(58) Field of Classification Search
CPC .............. H01L 27/2436; H01L 45/122; H01L 45/1253
See application file for complete search history.

(56) References Cited

U.S. PATENT DOCUMENTS

| | | | |
|---|---|---|---|
| 8,022,547 B2 | 9/2011 | Vaithyanathan et al. | |
| 8,941,089 B2* | 1/2015 | Gopalan | H01L 45/085 257/3 |
| 9,431,603 B1 | 8/2016 | Hsieh et al. | |
| 9,461,245 B1 | 10/2016 | Yang et al. | |
| 9,496,218 B2 | 11/2016 | Lee et al. | |
| 2011/0303887 A1* | 12/2011 | Otsuka | H01L 27/2436 257/1 |
| 2015/0221695 A1 | 8/2015 | Park et al. | |
| 2016/0111472 A1 | 4/2016 | Do et al. | |
| 2016/0218284 A1 | 7/2016 | Lin et al. | |

OTHER PUBLICATIONS

TIPO Office Action dated Apr. 20, 2018 in Taiwan application (No. 106134897).

* cited by examiner

*Primary Examiner* — Allison Bernstein

(74) *Attorney, Agent, or Firm* — McClure, Qualey & Rodack, LLP

(57) ABSTRACT

A semiconductor device includes a substrate and a memory structure disposed above the substrate. An embodied memory structure includes a bottom electrode disposed above the substrate, a barrier layer disposed at the bottom electrode, a resistance switching layer disposed on the bottom electrode and above the barrier layer, and a top electrode disposed on the resistance switching layer and covering the resistance switching layer. A bottom surface of the resistance switching layer is spaced apart from an uppermost surface of the barrier layer by a distance.

13 Claims, 21 Drawing Sheets

SEMICONDUCTOR DEVICE WITH MEMORY STRUCTURE

BACKGROUND

Field of the Invention

The disclosure relates in general to a semiconductor device with a memory structure, more particularly to a semiconductor device with a memory structure having a barrier-free resistance switching layer.

Description of the Related Art

Resistive random-access memory (RRAM or ReRAM) device is a non-volatile type of memory cell structure. Resistive memories attract much attention due to its simple MIM (Metal-Insulator-Metal) structure and promising scalability. Different forms of ReRAM have been disclosed, based on different dielectric materials, spanning from perovskites to transition metal oxides to chalcogenides.

Resistance switching memory cell structure, as the example of the transition metal oxide memory, is a group of two-terminal bistable memory devices that stores the data by different resistance levels. For example, a typical ReRAM device includes a tungsten (W) bottom electrode, a $WSi_xO_y$ memory layer, a Ti/TiN barrier layer and a TiN top electrode. The switching characteristic of the memory cell structure is very sensitive to the profile and uniformity of the bottom electrode configuration, which consequently has considerable effect on the reliability and electrical performance of the semiconductor device in practical application. It is desirable to develop a resistance switching memory cell structure with excellent structural profile and uniformity for improving the reliability and electrical properties such as great stability of data storage.

SUMMARY

The disclosure relates to a semiconductor device with a memory structure, which develops a memory structure has a barrier-free resistance switching layer, thereby improving the reliability and electrical performance of a semiconductor device applied with an embodied memory structure.

According to an embodiment, a semiconductor device is provided, including a substrate and a memory structure disposed above the substrate, wherein the memory structure includes a bottom electrode disposed above the substrate, a barrier layer disposed at the bottom electrode, a resistance switching layer disposed on the bottom electrode and above the barrier layer, and a top electrode disposed on the resistance switching layer and covering the resistance switching layer. A bottom surface of the resistance switching layer is spaced apart from an uppermost surface of the barrier layer by a distance.

The disclosure will become apparent from the following detailed description of the preferred but non-limiting embodiments. The following description is made with reference to the accompanying drawings.

DETAILED DESCRIPTION

Figure 1A:
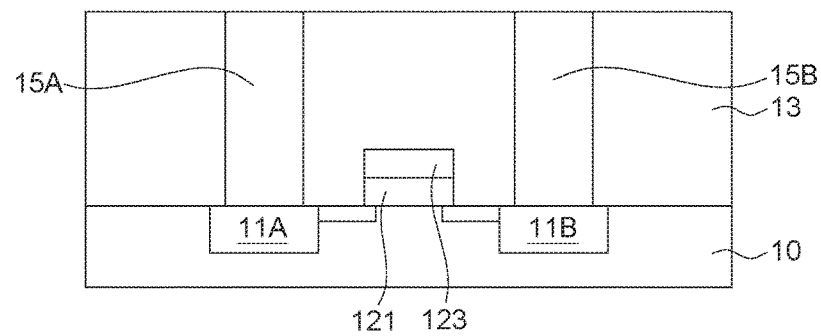
FIG. 1A-FIG. 1K illustrate one method of manufacturing a semiconductor device according to the first embodiment of the present disclosure.

In the embodiments of the present disclosure, a semiconductor device with a memory structure is provided. A memory structure of the embodiment develops a bottom electrode, a barrier-free resistance switching layer and a top electrode, wherein a barrier layer can be disposed at the sidewall surfaces or the bottom surface of the bottom electrode. According to the embodiments, an uppermost surface of the barrier layer is lower than a top surface of the bottom electrode at horizontal levels. Thus, in the embodied configurations, a bottom surface of the resistance switching layer is spaced apart from an uppermost surface of the barrier layer by a distance. Configuration of the embodied semiconductor device significantly improves the reliability and electrical performance of a semiconductor device applied with an embodied memory structure. For example, an embodied memory structure provides a detectable sensing window for SET/RESET operation of the memory structure.

Three embodiments are provided hereinafter with reference to the accompanying drawings for describing the related structural configurations and applicable manufacturing procedures. Also, an embodied memory structure having a barrier-free resistance switching layer can be disposed relatively to a conductive contact (ex: connecting source/drain of a transistor on a substrate), or can be disposed relatively to one of the vias in one of the inter-metal dielectric (IMD) layers. The embodied memory structures of the embodiments disposed relatively to a conductive contact are exemplified for illustration, but not for limitation.

Related details of structure and procedures, such as spatial arrangement and formation steps of the layers/elements, are further described in the embodiments. However, the present disclosure is not limited thereto. It is noted that not all embodiments of the invention are shown, and there may be other embodiments of the present disclosure which are not specifically illustrated. Modifications and variations can be made without departing from the spirit of the disclosure to meet the requirements of the practical applications. Also, the identical and/or similar elements of the embodiments are designated with the same and/or similar reference numerals for clear illustrations. It is also important to point out that the illustrations may not be necessarily be drawn to scale. Thus, the specification and the drawings are to be regard as an illustrative sense rather than a restrictive sense.

Moreover, use of ordinal terms such as "first", "second", etc., in the specification and claims to describe an element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

<First Embodiment>

FIG. 1A-FIG. 1K illustrate one method of manufacturing a semiconductor device according to the first embodiment of the present disclosure. Before forming an embodied memory structure, a structure having a transistor is provided. As shown in FIG. 1A, a substrate 10 is provided, a transistor is disposed on the substrate 10, and an inter-layer dielectric (ILD) layer 13 is disposed on the substrate 10 and covers the transistor according to one application. The transistor comprises a gate electrode (ex: poly-gate) 123 disposed on a gate insulating layer 121, two doping regions (ex: heavy doping concentration) such as a source region 11A and a drain region 11B, and the conductive contacts 15A and 15B disposed above the substrate 10 and within the ILD layer 13, wherein the conductive contacts 15A and 15B respectively connect (ex: directly contact) the source region 11A and the drain region 11B.

Figure 1B:
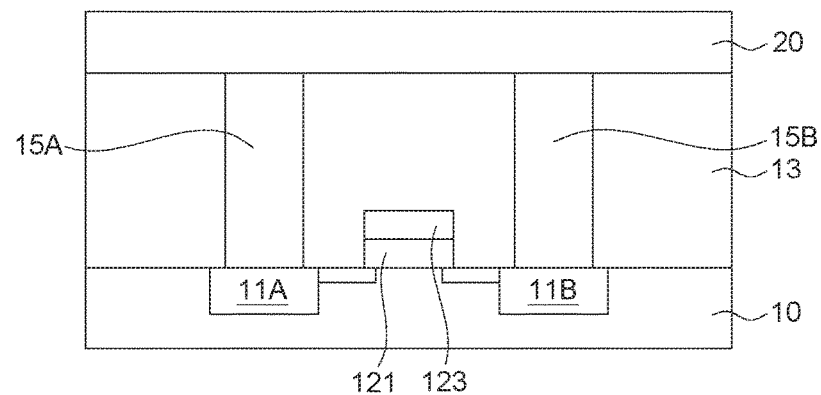
Figure 1C:
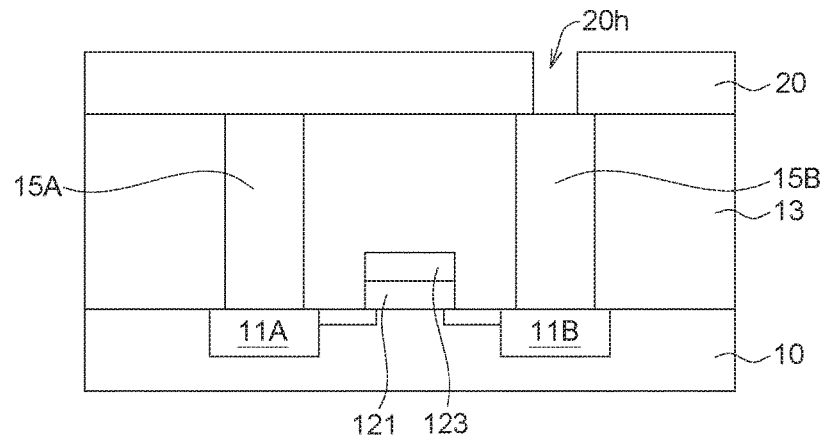

Another dielectric layer 20, such as an oxide layer, is deposited on the ILD layer 13, as shown in FIG. 1B. In one embodiment, the dielectric layer 20 as deposited has (but not limited to) a thickness in a range of about 200Å to about 2000Å; for example, about 1000Å. Afterwards, a hole 20h is formed in the dielectric layer 20, as shown in FIG. 1C, for defining a region for forming a bottom electrode later. The dielectric layer 20 may comprise the same material of the ILD layer 13 or other insulating materials.

Figure 1D:
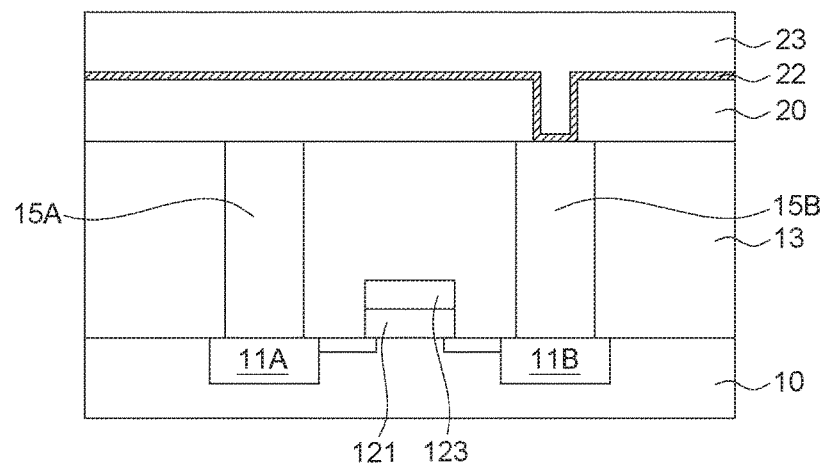

In one embodiment, a barrier film 22 (such as TiN) is deposited on the dielectric layer 20 and forms a liner in the hole 20h, followed by depositing a material layer (such as a metal layer 23, for forming a bottom electrode in the subsequent processes), as shown in FIG. 1D. In one embodiment, the barrier film 22 as deposited has (but not limited to) a thickness in a range of about 10Å to about 1000Å; for example, about 25Å. Additionally, material examples of the metal layer 23 (/bottom electrode) include, but not limited to, tungsten (W), hafnium (Hf), tantalum (Ta), Cu, Fe, Ti, Ni, TiN, TaN and other applicable materials.

Figure 1E:
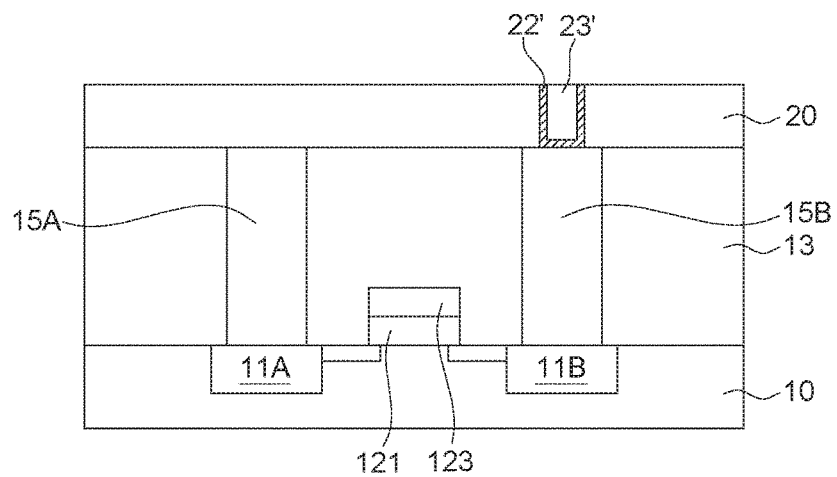

Then, the metal layer 23 and a portion of the barrier film 22 (positioned on the dielectric layer 20) are removed by a planarization step such as chemical-mechanical polishing (CMP), as shown in FIG. 1E. Thus, a patterned barrier film 22' and a patterned metal layer 23' are remained in the hole 20h.

Figure 1F:
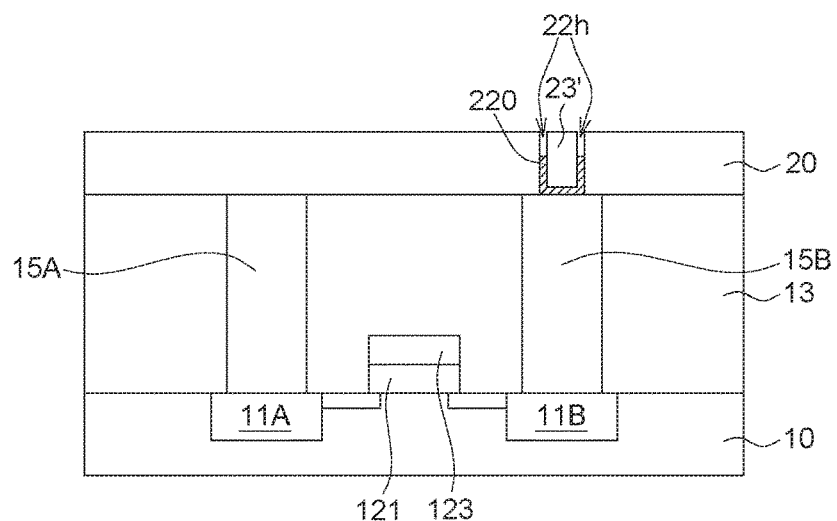

Next, the patterned barrier film 22' is partially removed, such as by an etching back step, to form a barrier layer 220 and a recess 22h on the barrier layer 220, as shown in FIG. 1F. It is noted that drawings herein depict cross-sectional view of the structure, and the recess 22h as formed does surround the patterned metal layer 23' from a top view of the structure.

Figure 1G:
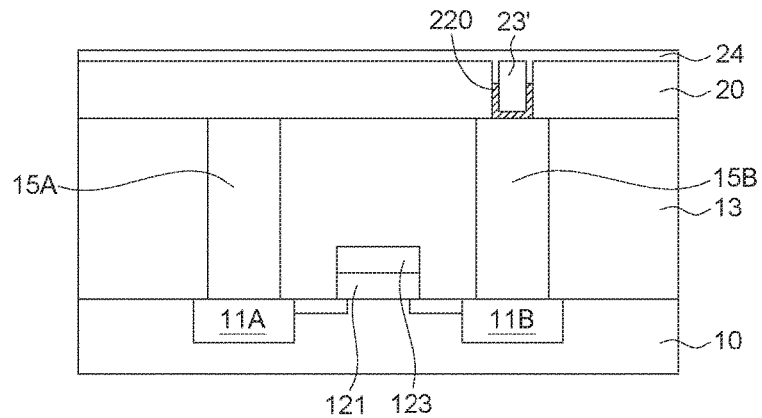
Figure 1H:
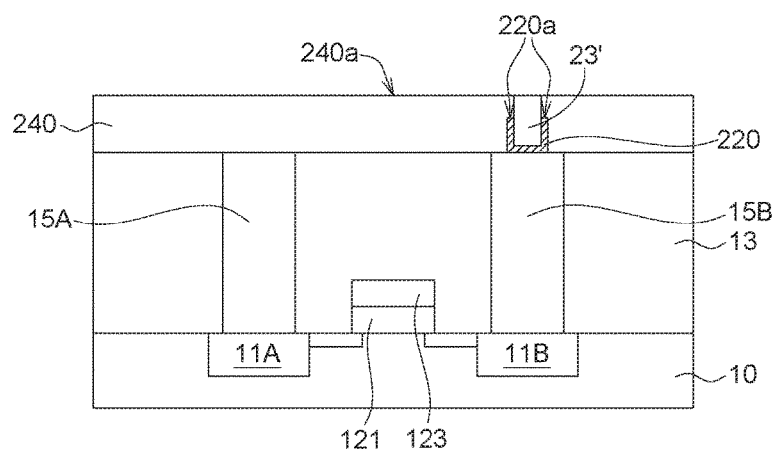

Another dielectric layer 24 is further formed on the dielectric layer 20 and the patterned metal layer 23' to fill the recess 22h, as shown in FIG. 1G. Then, the dielectric layers 24 and 20 are etched back or polished such as by CMP; thus, an insulation 240 is formed after CMP step, as shown in FIG. 1H. In one embodiment, the dielectric layers 24 and 20 may comprise the same material or different materials. Also, the dielectric layers 24 and 20 may comprise the same material or different materials as the ILD layer 13. In FIG. 1H, it is shown that the barrier layer 220 surrounds a bottom surface and parts of the sidewalls of the patterned metal layer 23'. Also, an uppermost surface 220a of the barrier layer 220 is lower than a top surface 240a of the insulation 240.

Figure 1I:
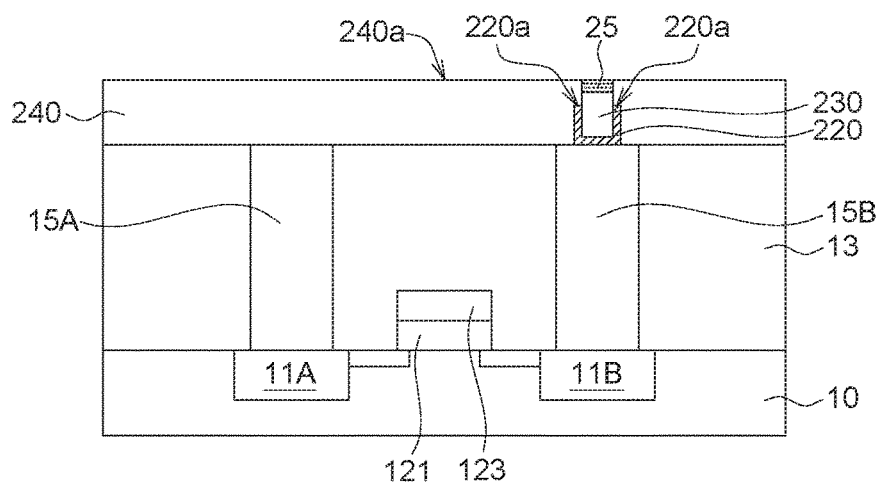

Afterwards, a resistance switching layer 25 is formed by such as a plasma oxidation step, as shown in FIG. 1I, and a top electrode is disposed on the resistance switching layer 25 to cover the resistance switching layer 25. In FIG. 1I, the resistance switching layer 25 is formed at a position higher than the uppermost surface 220a of the barrier layer 220. In one embodiment, the resistance switching layer 25 as formed has (but not limited to) a thickness of about 40Å. Additionally, material examples of the resistance switching layer 25 (single layer) include, but not limited to, $SiO_2$, $HfO_2$, TiOx, TiON, WOx, $Ta_2O_5$, $Al_2O_3$, and other applicable materials.

Figure 1J:
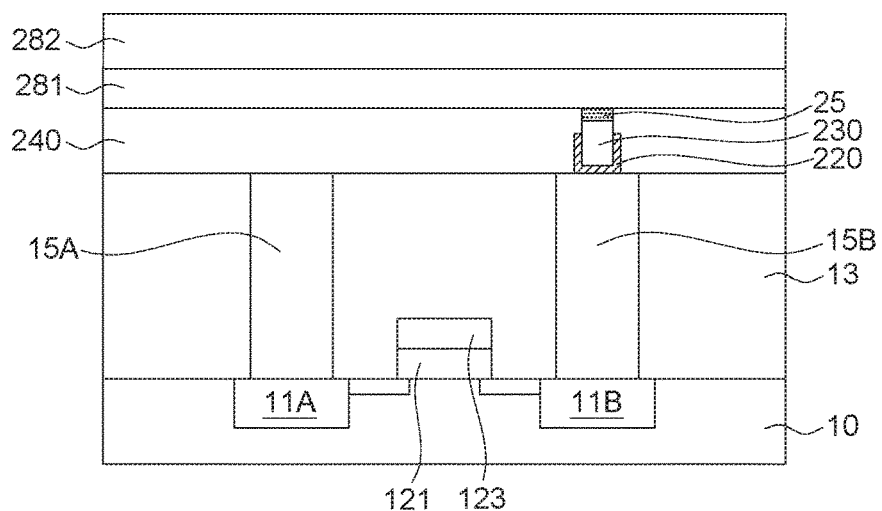
Figure 1K:
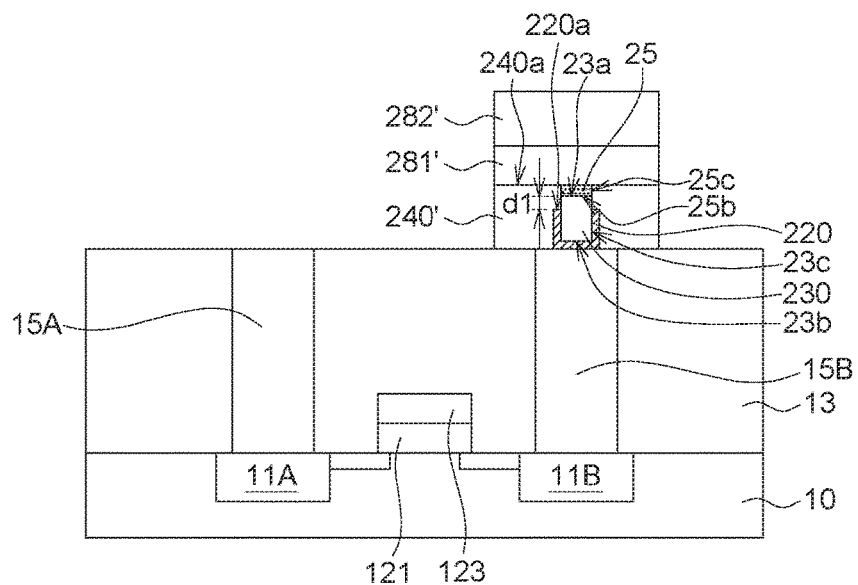

Afterwards, a Ti layer 281 arid a TiN layer 282 are disposed on the resistance switching layer 25, as shown in FIG. 1J; followed by a patterning procedure (ex: etching) to form a top electrode (containing a patterned Ti layer 281' arid a patterned TiN layer 282') and an insulating layer 240', as shown in FIG. 1K. It is known that other applicable layer(s) can be adopted for forming the top electrode herein, and the present disclosure has no particular limitation for the layers/materials of the top electrode. For example, material examples of the top electrode include, but not limited to, TiN, Ti, Ta, TaN, Cu, W, Pt, Ir, Ru, Ni, Al, and other applicable materials.

FIG. 1K depicts one semiconductor device according to the first embodiment of the present disclosure. As shown in FIG. 1K, the bottom surface 25b of the resistance switching layer 25 is higher than the uppermost surface 220a of the barrier layer 220, and spaced apart from the uppermost surface 220a of the barrier layer 220 by a distance d1. In one embodiment, the distance d1 is equal to or larger than 10Å (=1 nm). In another embodiment, the distance d1 is in a range of about 10Å to about 950Å. Also, the resistance switching layer 25 is directly formed on the bottom electrode 23', and the barrier layer 220 surrounds a bottom surface 23b and parts of the sidewalls 23c of the bottom electrode 23', wherein the uppermost surface 220a of the barrier layer 220 and the top surface 23a of the bottom electrode 23' are spaced apart by the distance d1. Moreover, the insulating layer 240' as shown in FIG. 1K surrounds the resistance switching layer 25 and directly contacts (physically contact) the entire sidewalls 25c of the resistance switching layer 25. Materials of the insulating layer 240' and the ILD layer 13 can be the same or different, the disclosure has no particular limitation thereto. Therefore, the resistance switching layer 25 of the embodiment as formed is free of barrier contact. The resistance switching layer 25 is surrounded by the top electrode (i.e. the patterned Ti layer 281' and the patterned TiN layer 282'), the bottom electrode 23' and the insulating layer 240'.

According to the operation examinations, the embodied memory structure possesses a recognized region existing between a low resistance state (LRS) and a high resistance state (HRS) even at a very low failure rate (ex: $10^{-5}$ probability (=10ppm)), and a wider sensing window for SET/RESET operation exists as compared to a conventional memory structure (i.e. having a memory layer surrounded by a barrier layer). Thus, configuration of the embodied semiconductor device as shown in FIG. 1K significantly improves the reliability and electrical performance of the semiconductor device applied with the embodied memory structure.

<Second Embodiment>

The memory structure of the first embodiment is formed on the ILD layer 13 (i.e. formed above the original conductive contacts 15A/15B; please see FIG. 1K). In the second embodiment, parts of a memory structure, such as the bottom electrode 230 and the resistance switching layer 25, are embedded in the ILD layer (please see FIG. 2K, 2L/3K, 3L and the descriptions later).

Figure 2A:
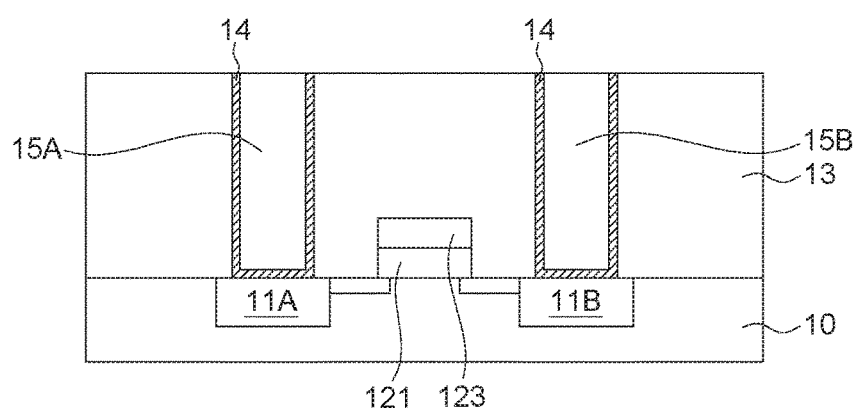
FIG. 2A-FIG. 2L illustrate one method of manufacturing a semiconductor device according to the second embodiment of the present disclosure.

FIG. 2A-FIG. 2L illustrate one method of manufacturing a semiconductor device according to the second embodiment of the present disclosure. Before forming an embodied memory structure, a structure having a transistor is provided. As shown in FIG. 2A, a substrate 10 is provided, a transistor is disposed on the substrate 10, and an inter-layer dielectric (ILD) layer 13 is disposed on the substrate 10 and covers the transistor according to one application. The transistor comprises a gate electrode (ex: poly-gate) 123 disposed on a gate insulating layer 121, two doping regions (ex: N+ heavy doping concentration) such as a source region 11A and a drain region 11B, the conductive contacts 15A and 15B (such as tungsten W) disposed above the substrate 10 and within the ILD layer 13, and contact barrier films 14 disposed at sidewalls of the conductive contact 15A and 15B, wherein the conductive contacts 15A and 15B respectively connect (ex: directly contact) the source region 11A and the drain region 11B. In one embodiment, the contact barrier films 14 are Ti/TIN barrier films.

Figure 2B:
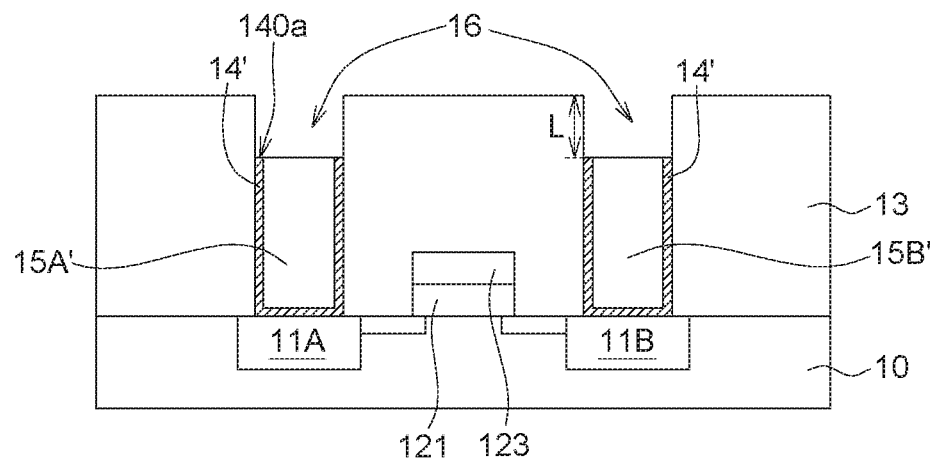
Figure 2C:
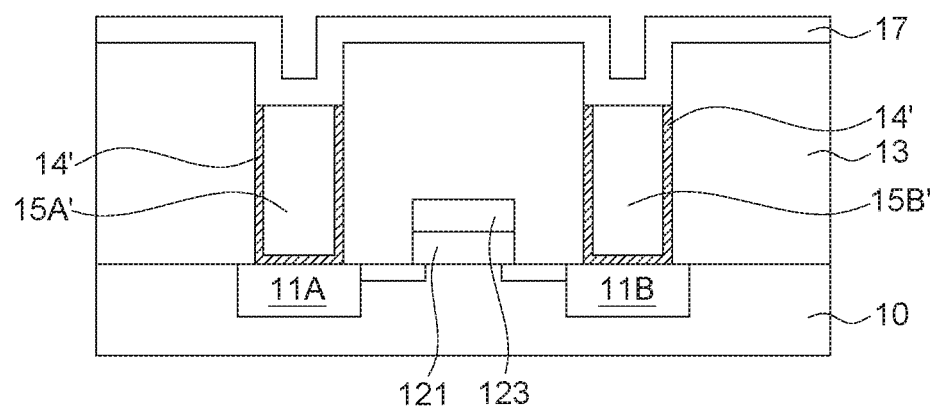

As shown in FIG. 2B, the conductive contacts 15A, 15B and the contact barrier films 14 are partially removed (ex: etched back) to form the cavities 16 above the patterned contact barrier films 14' and the patterned conductive contacts 15A' and 15B'. In one embodiment, each of the cavities 16 has (but not limited to) a depth L of about 500Å to about 2000Å.

Afterwards, conformal deposition of a metal layer 17 is conducted for shrinking down the critical dimension (CD) of a bottom electrode as formed in the subsequent procedures. In one embodiment, the metal layer 17 could be formed by chemical vapor deposition (CVD) as being easier to form a conformal film. Material examples of the metal layer 17 include, but not limited to, TiN, Ti, Cu, Hf, Al, Pt, Ir, Ru, Ta, TaN, and other applicable materials. Practically, for the applications of back end of line (BEOL) procedures (lower process temperature <400° C.), material examples of the metal layer 17 include, but not limited to, TiN, TaN, implanting Ta or Ti or Al, or other applicable materials for forming a conformal film more easily by CVD. Also, in one embodiment, the metal layer 17 has (but not limited to) a thickness of about 100Å to about 1000Å.

Figure 2D:
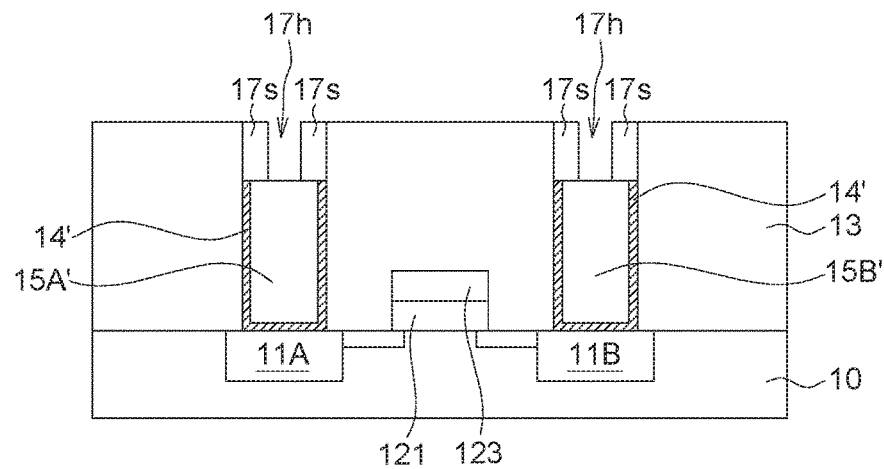

Next, the metal layer 17 is partially removed (planarization) by stopping on the ILD layer 13, so that the metal spaces 17S and the holes 17h are formed in the cavities 16, as shown in FIG. 2D. Since the metal layer 17 has higher selectivity to the material (such as oxide or nitride) of the ILD layer 13, the ILD layer 13 could provide a good end-point for the planarization of the metal layer 17. The metal spaces 17S could shrink down the critical dimension (CD) of a bottom electrode and reduce SET/RESET operation current.

Figure 2E:
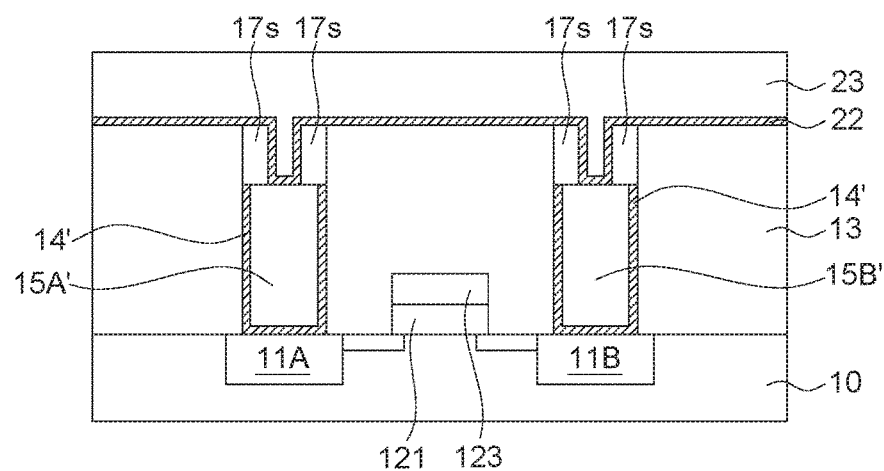
Figure 2F:
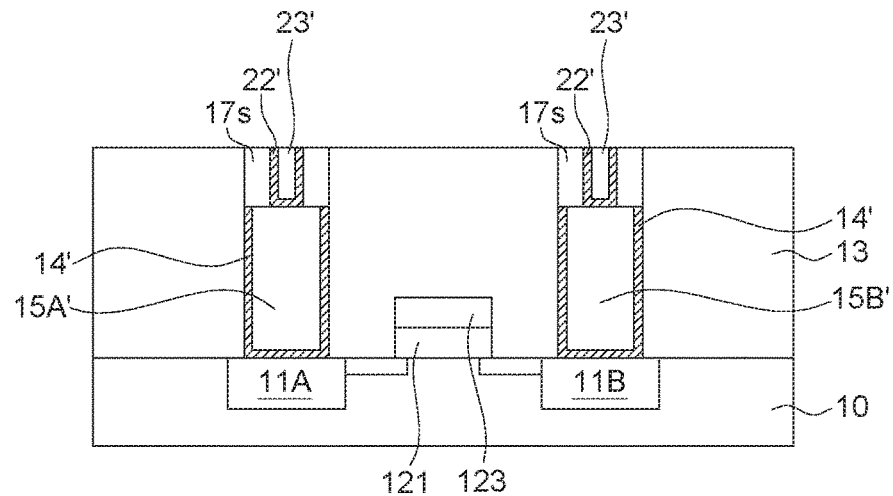

Then, as shown in FIG. 2E, a barrier film 22 (such as TiN) is deposited on the ILD layer 13 and the metal spaces 17S, and the barrier film 22 also forms a liner in the hole 17h, followed by depositing a material layer such as a metal layer 23(for forming a bottom electrode in the subsequent processes). The metal layer 23 and a portion of the barrier film 22 are removed such as by CMP (stopping on the ILD layer 13), to form a patterned barrier film 22' and a patterned metal layer 23' between the metal spaces 17S, as shown in FIG. 2F.

Figure 2G:
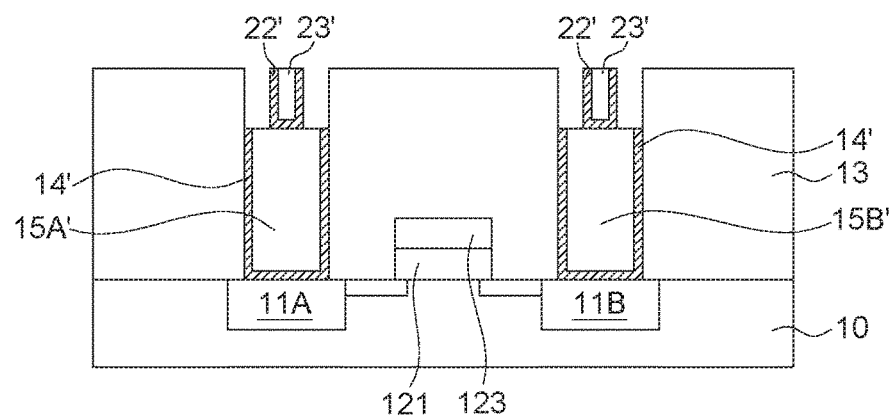

Afterwards, as shown in FIG. 2G, the metal spaces 17S are etched away (due to high selectivity of TiN/W or TiN/oxide) by dry etching or wet etching. In this exemplification, the metal spaces 17S are removed completely, but the disclosure is not limited thereto (another exemplification is described later in FIG. 3G-FIG. 3L). The conformal metal spaces 17S not only shrinks down the critical dimension (CD) of a bottom electrode (ex: W), but also open a larger space for following etch of the patterned barrier film 22' (ex: TiN). Etch of the patterned barrier film 22' in the presence of the metal spacer 17 will be much easier to perform than that without the metal spacer 17.

Figure 2H:
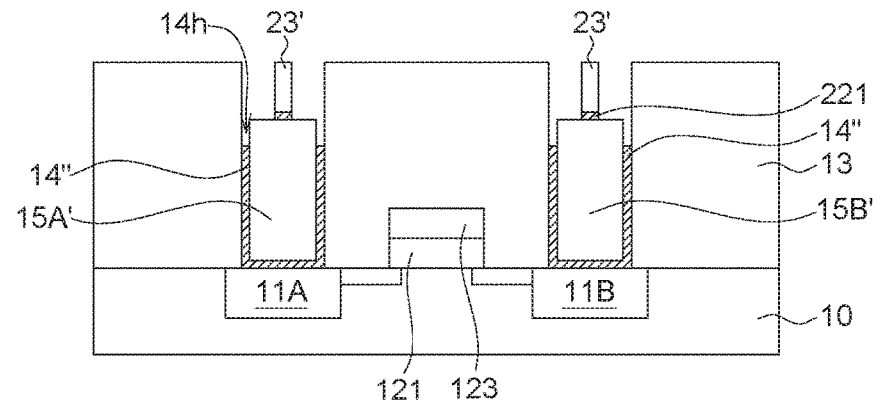
Figure 2I:
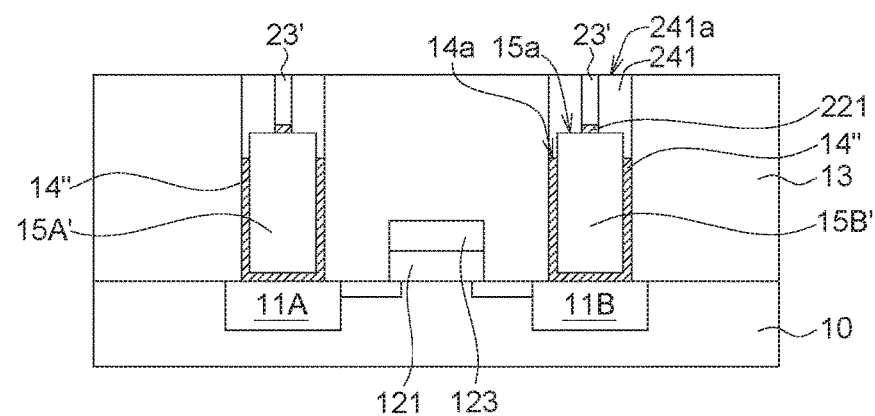

Then, the patterned barrier film 22' is partially removed such as by etching, to form a barrier layer 221, and the patterned contact barrier films 14' are also partially removed to form the recesses 14h above the recessed contact barrier films 14'', as shown in FIG. 2H. The patterned barrier film 22' is disposed merely at a bottom surface of the patterned metal layer 23', and the side walls of the patterned metal layer 23' are free of the patterned barrier film 22'. Next, another dielectric layer (such as an oxide layer) is further deposited, followed by CMP, so as to form an insulating layer 241 for filling up the space surrounding the patterned metal layer 23' and the barrier layer 221, and also filling up the recesses 14h, as shown in FIG. 2I. The insulating layer 241 contacts the top surface 14a of the recessed contact barrier films 14'', and covers at least the top surface 15a of the patterned conductive contact 15B'.

Figure 2J:
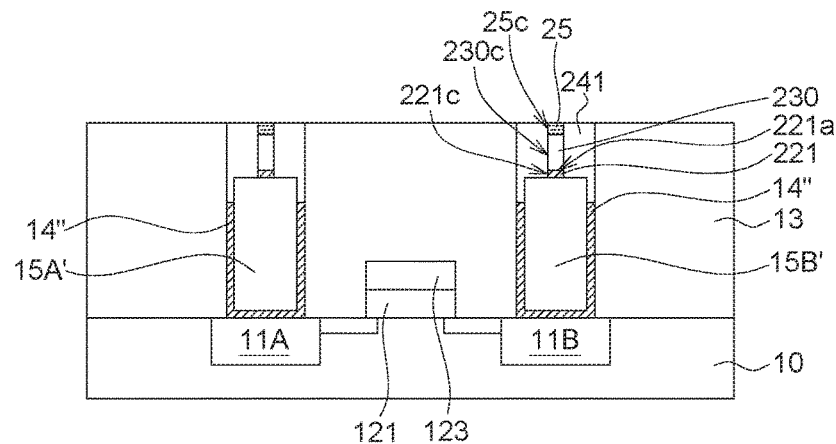
Figure 2K:
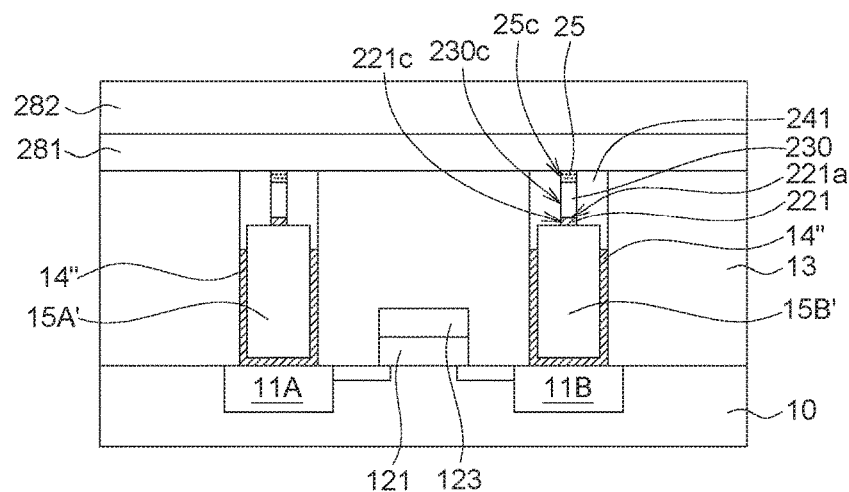

Afterwards, a resistance switching layer 25 is formed by such as a plasma oxidation step, as shown in FIG. 2J, and the films such as a Ti layer 281 and a TiN layer 282 (for forming a top electrode) are disposed on the resistance switching layer 25 to cover the resistance switching layer 25, as shown in FIG. 2K. In FIG. 2J-2K, the resistance switching layer 25 is formed at a position higher than the uppermost surface 221a of the barrier layer 221. Also, in one embodiment, the sidewalls 25c of the resistance switching layer 25, the sidewalls 230c of the bottom electrode 230 and the sidewalls 221c of the barrier layer 221 are substantially aligned to each other.

Figure 2L:
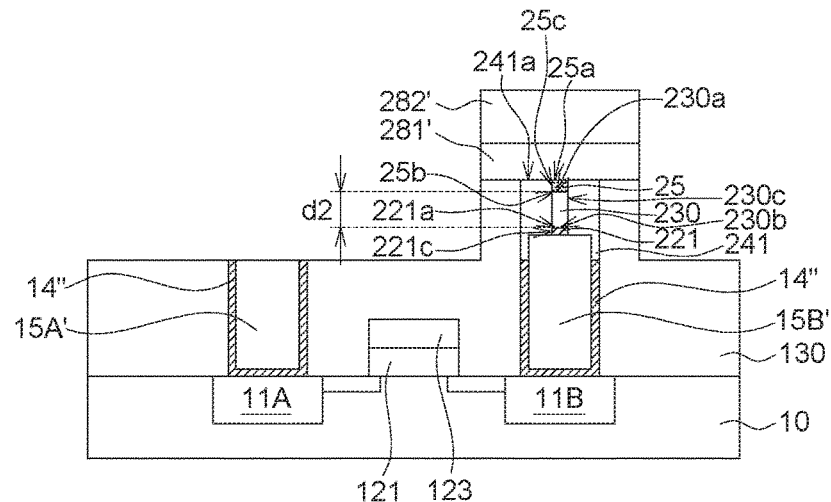

Then, a patterning procedure (ex: etching) is conducted to form a top electrode (containing a patterned Ti layer 281' and a patterned TiN layer 282'), as shown in FIG. 2L. Similarly, other applicable layer(s) can be adopted for forming the top electrode herein, and the present disclosure has no particular limitation for the layers/materials of the top electrode. In FIG. 2L, the ILD layer 13, the Ti layer 281 and the TiN layer 282 are etched to form the patterned ILD layer 130, the patterned Ti layer 281' and a patterned TiN layer 282', wherein the patterned ILD layer 130 surrounds the insulating layer 241.

FIG. 2L depicts one semiconductor device according to the second embodiment of the present disclosure. As shown in FIG. 2L, the barrier layer 221 is disposed on the conductive contact (ex: the patterned conductive contact 15B'), such as positioned between the conductive contact (ex: the patterned conductive contact 15B') and the bottom electrode 230. In FIG. 2L, the bottom surface 25b of the resistance switching layer 25 is higher than the uppermost surface 221a of the barrier layer 221, and spaced apart from the uppermost surface 221a of the barrier layer 221 by a distance d2. In one embodiment, the distance d2 is in a range of about 450Å to about 950Å. Also, in the exemplification of FIG. 2L, the top surfaces 14a of the contact barriers (i.e. the recessed contact barrier films 14'') are lower than the top surface 15a of the conductive contact (i.e. the patterned conductive contact 15B'). According to the second embodiment, the insulating layer 241 (such as an oxide layer) surrounds the resistance switching layer 25, the bottom electrode 230 and the barrier layer 221. For example, in FIG. 2L, the insulating layer 241 directly contacts the entire sidewalls 25c of the resistance switching layer 25, the sidewalls 221c of the barrier layer 221 and the sidewalls 230c of the bottom electrode 230. In other words, the resistance switching layer 25, the barrier layer 221 and the bottom electrode 230 are embedded in the insulating layer 241 (such as an oxide layer). Materials of the insulating layer 241 and the ILD layer 13 can be the same or different, the disclosure has no particular limitation thereto. Therefore, the resistance switching layer 25 of the second embodiment as formed is free of barrier contact, wherein the resistance switching layer 25 is surrounded by the top electrode (i.e. the patterned Ti layer 281' and the patterned TiN layer 282'), the bottom electrode 230 and the insulating layer 241, as shown in FIG. 2L.

Other manufacturing methods of the second embodiment can be adopted; for example, the steps of FIG. 2G-FIG. 2L (i.e. the metal spaces 17S removed completely) can be modified to the steps of FIG. 3G-FIG. 3L (i.e. the metal spaces 17S removed partially). FIG. 3A-FIG. 3L illustrate another method of manufacturing a semiconductor device according to the second embodiment of the present disclosure. It is noted that the configurations of FIG. 3A-FIG. 3H are identical to that of FIG. 2A-FIG. 2H (i.e. the steps of FIG. 2G-FIG. 2L can be replaced by that of FIG. 3G-FIG. 3L).

Figure 3A:
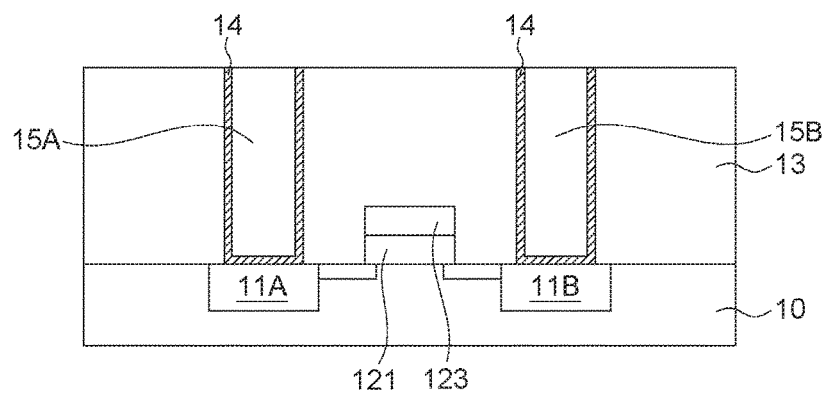
FIG. 3A-FIG. 3L illustrate another method of manufacturing a semiconductor device according to the second embodiment of the present disclosure.
Figure 3B:
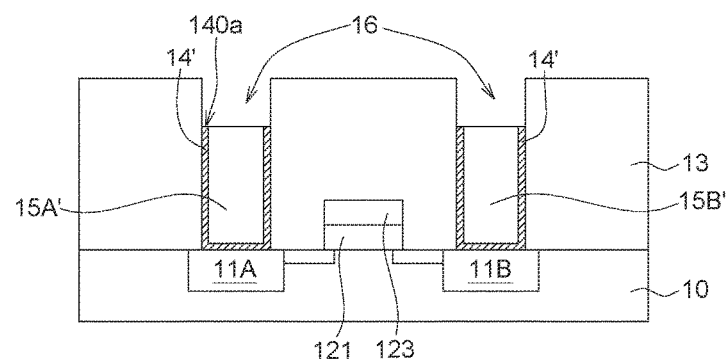
Figure 3C:
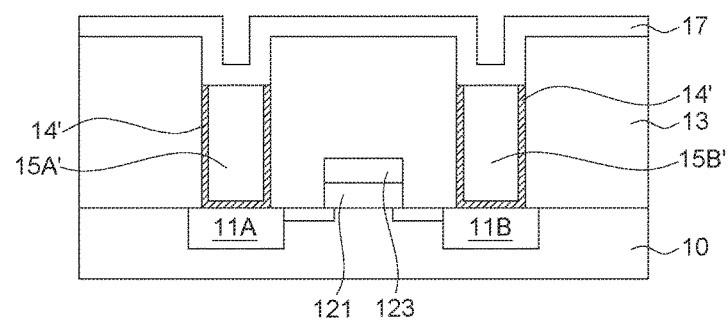
Figure 3D:
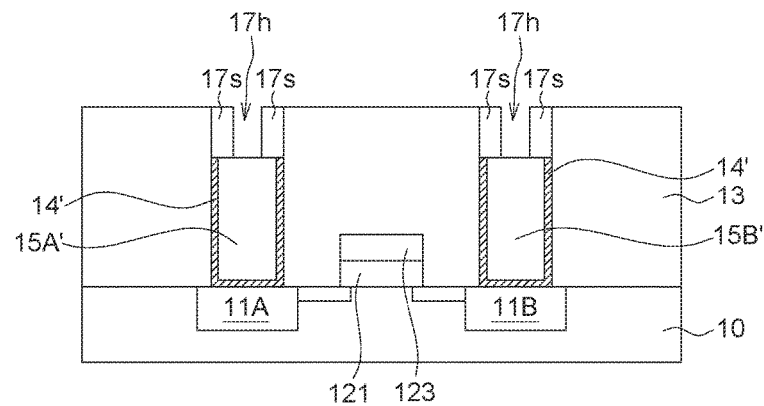
Figure 3E:
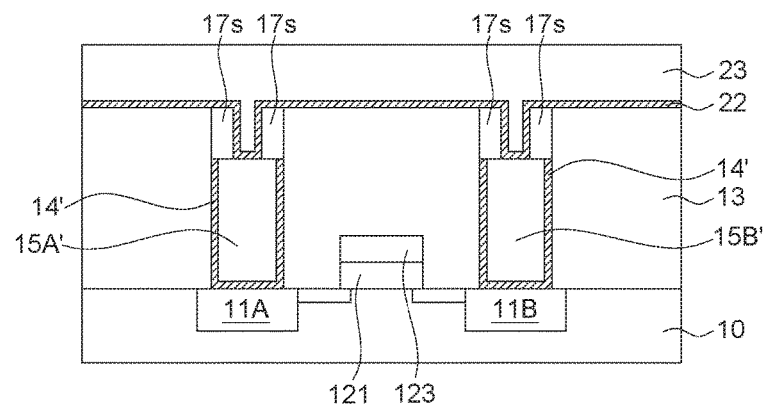
Figure 3F:
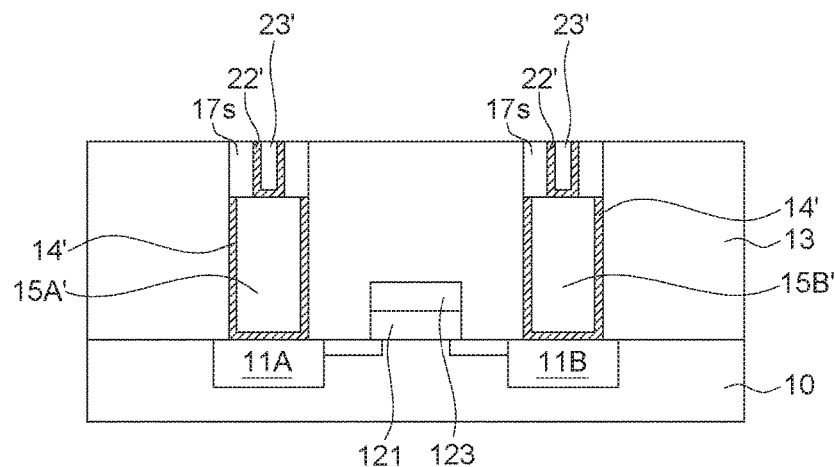
Figure 3G:
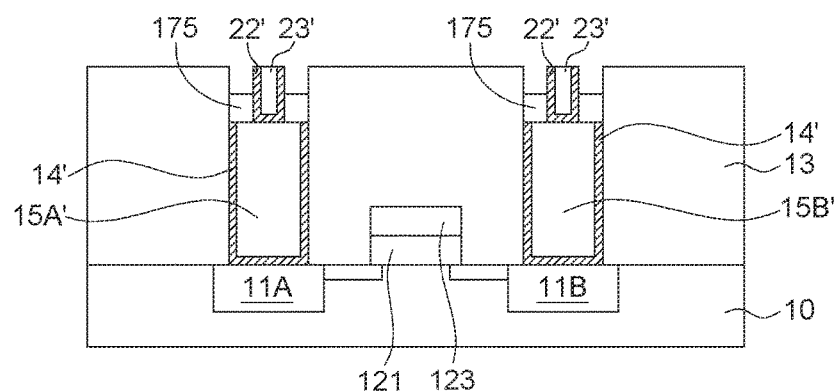
Figure 3H:
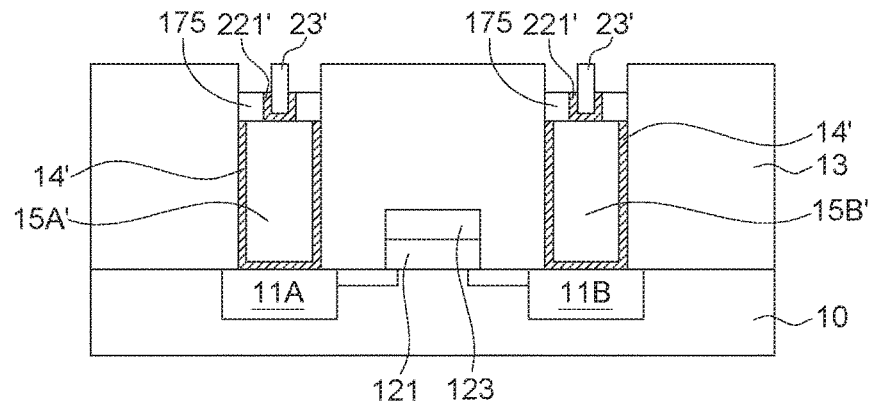
Figure 3I:
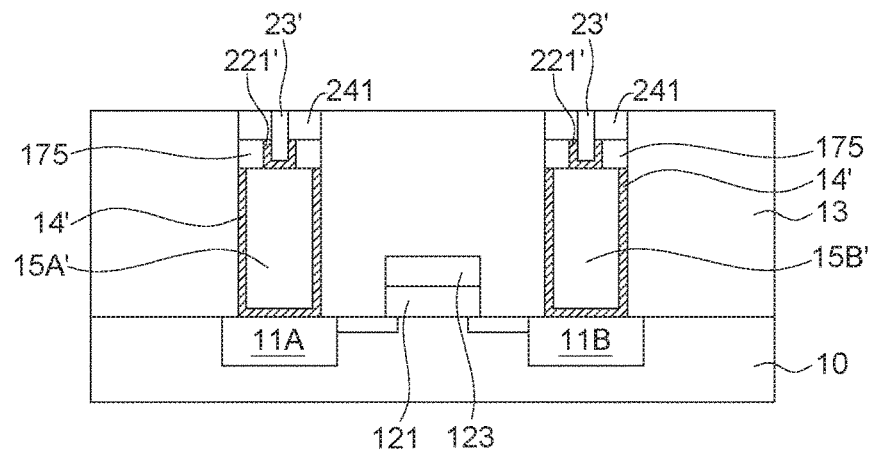
Figure 3J:
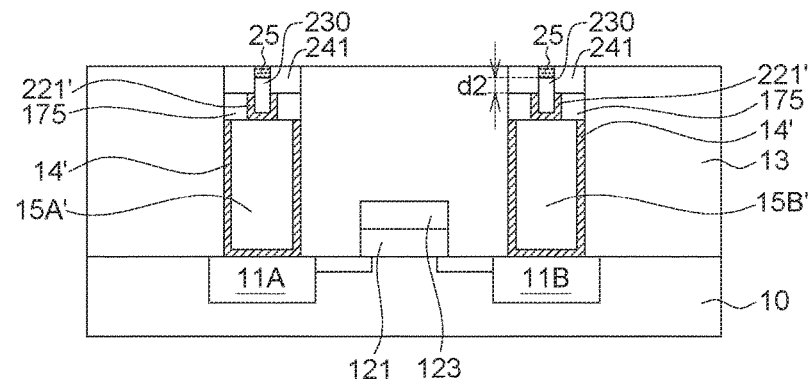
Figure 3K:
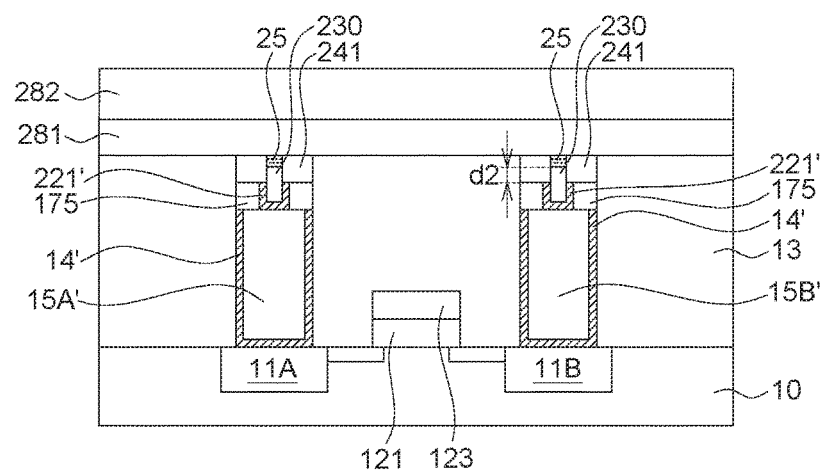
Figure 3L:
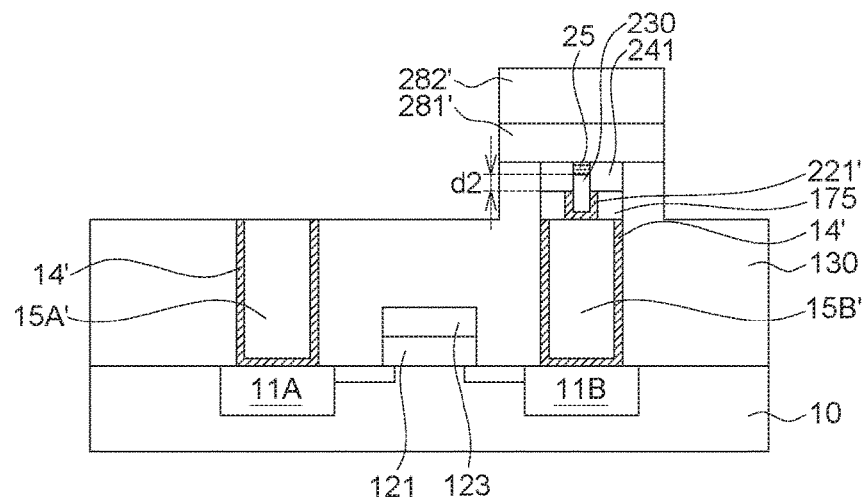

As shown in FIG. 3G, after polishing the metal layer 23 (as the step described in FIG. 2F above), the metal spaces 17S are merely partially removed to form the patterned metal spaces 175, wherein the patterned metal spaces 175 cover the patterned contact barrier films 14' and expose parts of the patterned barrier film 22'. Then, the patterned barrier film 22' is partially removed such as by etching, to form a barrier layer 221', as shown in FIG. 3H. The patterned contact barrier films 14' are remained since they are protected by the patterned metal spaces 175. Next, an insulating layer 241 is formed on the patterned metal spaces 175 and directly contacts the patterned metal layer 23', as shown in FIG. 3I. Afterwards, similar steps such as forming a resistance switching layer 25 as shown in FIG. 3J, forming a Ti layer 281 and a TiN layer 282 as shown in FIG. 3K, and TE patterning procedure (i.e. forming a patterned Ti layer 281' and a patterned TiN layer 282') as shown in FIG. 3L, are conducted, and the final structure is presented in FIG. 3L. The details are not redundantly described.

Similarly, according to the operation examinations, the second embodied memory structures as shown in FIG. 2L and FIG. 3L possess a recognized region existing between LRS and HRS even at a very low failure rate (ex: $10^{-5}$ probability (10ppm)), and a wider sensing window exists for SET/RESET operation exists as compared to a conventional memory structure (i.e. having a memory layer surrounded by a barrier layer). Thus, configurations of the second embodied semiconductor devices as shown in FIG. 2L and FIG. 3L significantly improve the reliability and electrical performance of the semiconductor device applied with the second embodied memory structures.

<Third Embodiment>

In the third embodiment, one of the conductive contacts (ex: for connecting the source/drain region of a transistor on the substrate 10) disposed within the ILD layer 13 is adopted for functioning as a bottom electrode of an embodied memory structure.

FIG. 4A-FIG. 4G illustrate one method of manufacturing a semiconductor device according to the third embodiment of the present disclosure. Before forming an embodied memory structure, a structure having a transistor is provided. Similar to FIG. 2A, the transistor disposed on the substrate 10 in FIG. 4A comprises a gate insulating layer 121, a gate electrode (ex: poly-gate) 123, a source region 11A and a drain region 11B, an ILD layer 13, the contact barrier films 14 (ex: Ti/TiN), and the conductive contact 15A and 15B.

Figure 4A:
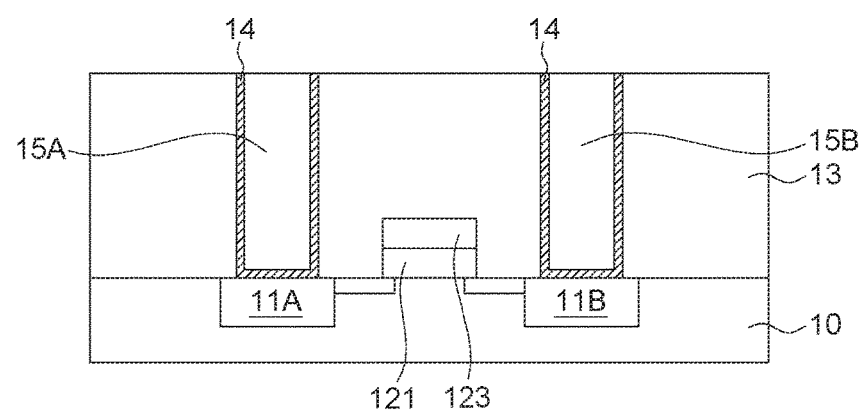
FIG. 4A-FIG. 4G illustrate one method of manufacturing a semiconductor device according to the third embodiment of the present disclosure.
Figure 4B:
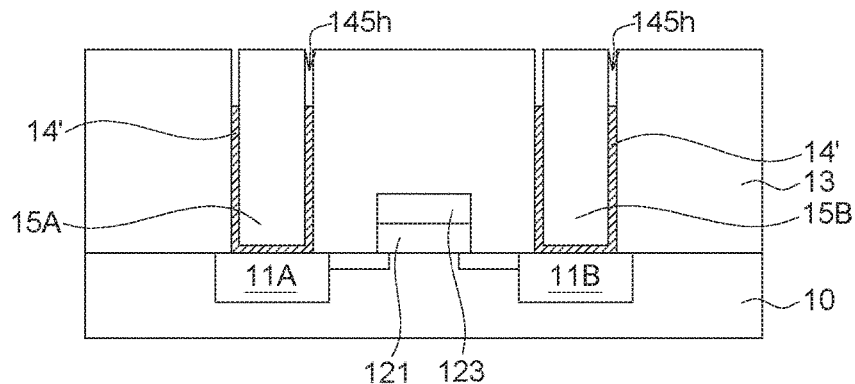
Figure 4C:
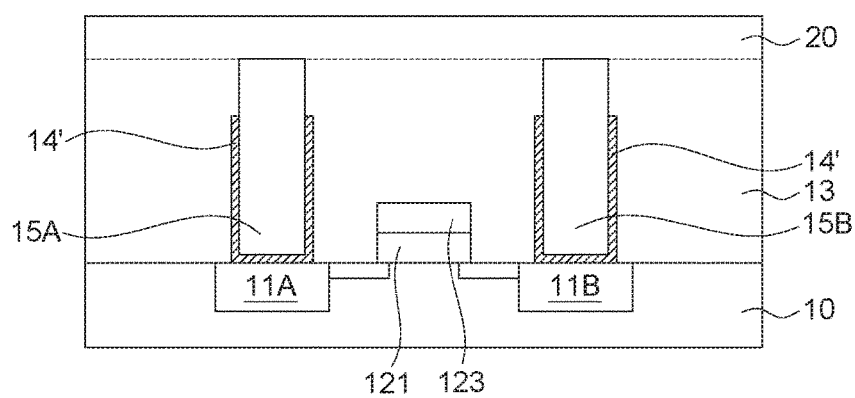
Figure 4D:
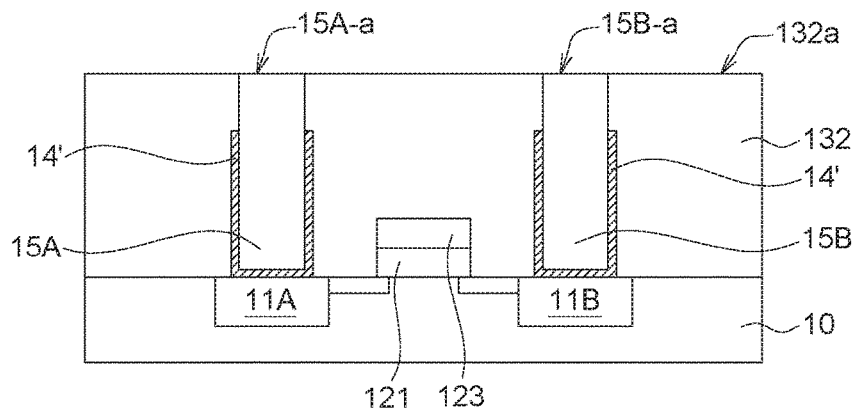

The contact barrier films 14 are partially removed, such as etching back, to form the recesses 145h and the patterned contact barrier films 14', as shown in FIG. 4B. In one embodiment, each of the recesses 145h has a depth of equal to or larger than about 50Å. Then, another dielectric layer 20, such as an oxide layer, is deposited on the IUD layer 13 for filling up the recesses 145h, as shown in FIG. 40. In one embodiment, the dielectric layer 20 and the ILD layer 13 may comprise the same material (or different materials; the disclosure has no limitation thereto). The dielectric layer 20 is planarized such as by CMP (ex: oxide etching back) to expose the top surfaces 15A-a and 15B-a of the conductive contact 15A and 15B, as shown in FIG. 4D. Also, the remaining ILD after dielectric planarization as shown in FIG. 4D can be referred as an insulating layer 132.

Figure 4E:
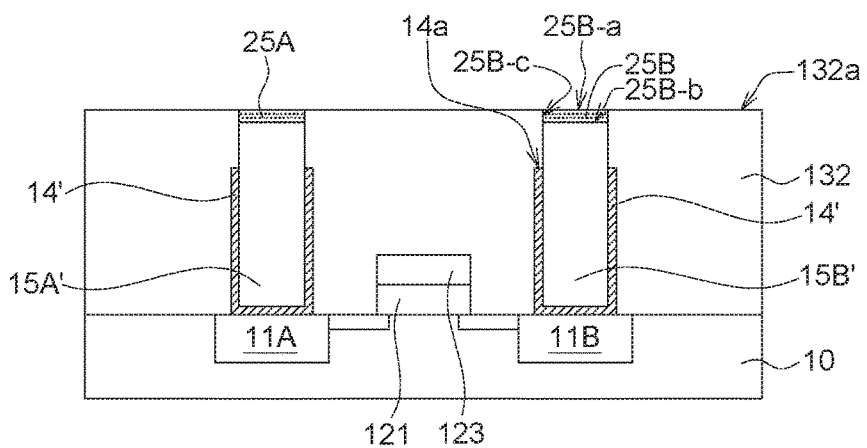
Figure 4F:
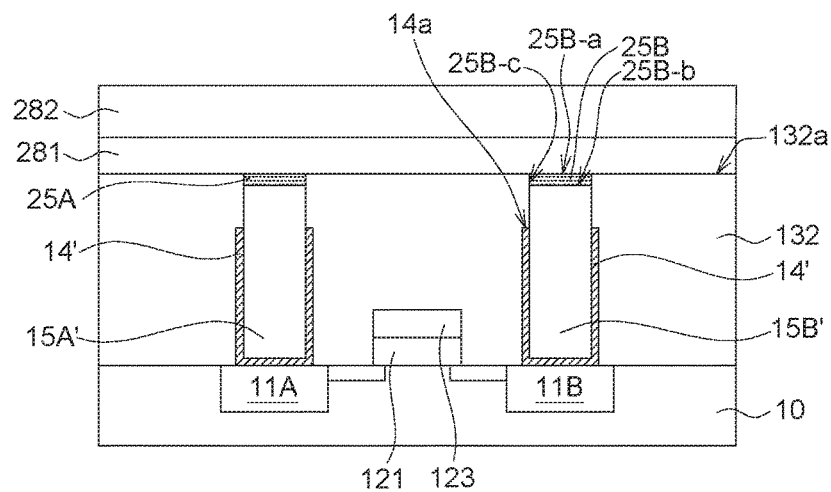
Figure 4G:
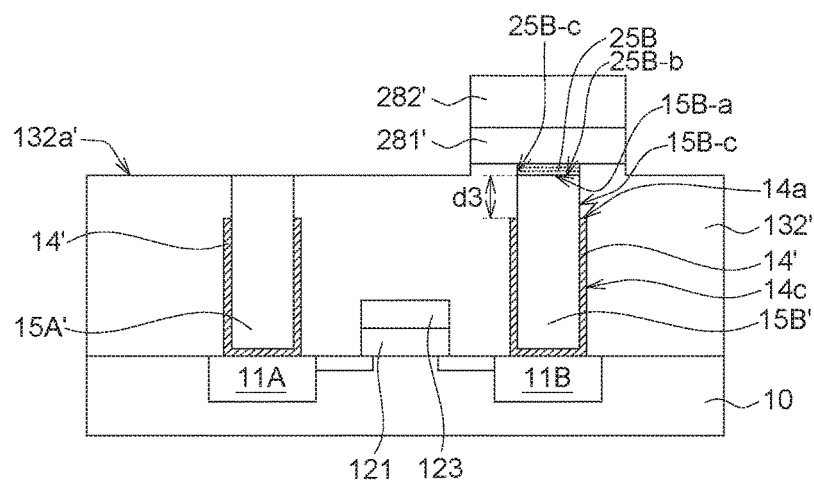

Then, a resistance switching layer 25B is formed on the patterned conductive contacts 15A' and 15B' by a plasma oxidation step, as shown in FIG. 4E (ex: WOx formation). Afterwards, a top electrode is formed on the resistance switching layer 25B, such as depositing a Ti layer 281 and a TiN layer 282, as shown in FIG. 4F; and forming a patterned Ti layer 281' and a patterned TiN layer 282' by a patterning procedure, as shown in FIG. 4G. Also, the resistance switching layer 25B on the patterned conductive contact 15A' is removed during the patterning procedure; please see the patterned conductive contact 15A' within the patterned insulating layer 132' in FIG. 4G. (i.e. the top surface 132a' of the patterned insulating layer 132' is substantially aligned with the top surface of the patterned conductive contact 15A').

FIG. 4G depicts one semiconductor device according to the third embodiment of the present disclosure. As shown in FIG. 4G, the barrier layer (i.e. the patterned contact barrier films 14') is disposed at the sidewalls of the conductive contact (ex: the patterned conductive contact 15B'), and the top surface 14a of the barrier layer (i.e. the patterned contact barrier films 14') is lower than the bottom surface 15B-b of the patterned conductive contact 15B', in particular, lower than the bottom surface 25B-b of the resistance switching layer 25B. In FIG. 4G, the bottom surface 25B-b of the resistance switching layer 25B (or the top surface 15B-a of the patterned conductive contact 15B') is spaced apart from the top surface 14a of the barrier layer (i.e. the patterned contact barrier films 14') by a distance d3. In one embodiment, the distance d3 is at least larger than about 40Å. According to the third embodiment, the patterned insulating layer 132' (such as an oxide layer) surrounds the resistance switching layer 25B, the bottom electrode (i.e. the patterned conductive contact 15B' acting as a BE in the third embodiment) and the barrier layer (i.e. the patterned contact barrier films 14' acting as a barrier layer in the third embodiment). Thus, as shown in FIG. 4E, the insulating layer 132 directly contacts the entire sidewalls 25B-c of the resistance switching layer 25B, the sidewalls 14c of the barrier layer (i.e. the patterned contact barrier films 14') and parts of the sidewalls 15B-c of the bottom electrode (i.e. the patterned conductive contact 15B').

Similarly, according to the operation examinations, the third embodied memory structure as shown in FIG. 4G possess a recognized region existing between LRS and HRS even at a very low failure rate (ex: $10^{-5}$ probability (10ppm)), and a wider sensing window also exists for SET/RESET operation exists as compared to a conventional memory structure (i.e. having a memory layer surrounded by a barrier layer). Thus, the configuration of the third embodied semiconductor device as shown in FIG. 4G significantly improves the reliability and electrical performance of a semiconductor device applied with the third embodied memory structure.

According to the descriptions above, it is noted that those material examples of related layers as listed above are provided for illustration, not for limitation. Similarly, those numerical values listed above are provided for illustration, not for limitation. The numerical values of the related components or distances, such as the thicknesses of the barrier layer (220/221/14'), the resistance switching layer (25/25B) and the distance d1/d2/d3, can be varied and/or determined according to the requirements of the actual applications.

According to the aforementioned descriptions, a memory structure of the embodiment develops a bottom electrode, a barrier-free resistance switching layer and a top electrode, wherein a barrier layer can be disposed at the sidewall surfaces or the bottom surface of the bottom electrode. According to the embodiments, an uppermost surface of the barrier layer is lower than a top surface of the bottom electrode at horizontal levels. Thus, in the embodied configurations, a bottom surface of the resistance switching layer is spaced apart from an uppermost surface of the barrier layer by a distance. Configuration of the embodied semiconductor device significantly improves the reliability and electrical performance of the semiconductor device applied with the embodied memory structure. For example, an embodied memory structure possesses a recognized region existing between a low resistance state (LRS) and a high resistance state (HRS) at a very low failure rate (such as $10^{-5}$ probability (10ppm)) to provide a sensing window for SET/RESET operation. Also, the methods for manufacturing the embodied semiconductor devices adopt simple and non-expensive procedures, which are suitable for mass production, and also efficiently obtain the embodied memory structures with the improved electrical characteristics in the applications.

Other embodiments with different configurations of known elements in the device can be applicable, and the arrangement depends on the actual needs of the practical applications. It is, of course, noted that the configurations of figures are depicted only for demonstration, not for limitation. It is known by people skilled in the art that the shapes or positional relationship of the constituting elements and the procedure details could be adjusted according to the requirements and/or manufacturing steps of the practical applications.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor device, comprising:
    a substrate; and
    a memory structure disposed above the substrate, and the memory structure comprising:
        a bottom electrode, disposed above the substrate;
        a barrier layer, disposed at the bottom electrode;
        a resistance switching layer, disposed on the bottom electrode and above the barrier layer, wherein a bottom surface of the resistance switching layer is spaced apart from an uppermost surface of the barrier layer by a distance, and sidewalls of the resistance switching layer and sidewalls of the bottom electrode are aligned to each other; and
        a top electrode, disposed on the resistance switching layer and covering the resistance switching layer.

2. The semiconductor device according to claim 1, further comprising an insulating layer directly contacting entire sidewalls of the resistance switching layer.

3. The semiconductor device according to claim 2, wherein the insulating layer is made of a material comprising silicon nitride, silicon oxide, or silicon oxide nitride.

4. The semiconductor device according to claim 1, wherein the uppermost surface of the barrier layer is lower than a bottom surface of the resistance switching layer.

5. The semiconductor device according to claim 1, wherein the distance is equal to or larger than 10Å.

6. The semiconductor device according to claim 1, wherein the distance is in a range of 10Å to 950Å.

7. The semiconductor device according to claim 1, further comprising:
    an interlayer dielectric (ILD) layer, disposed above the substrate; and
    a conductive contact functioning as the bottom electrode, disposed above the substrate and within the ILD layer,
    wherein at least the resistance switching layer and the top electrode are disposed above the conductive contact, and the bottom surface of the resistance switching layer is higher than the uppermost surface of the barrier layer.

8. The semiconductor device according to claim 1, wherein the barrier layer is at least disposed at the sidewalls of the bottom electrode.

9. The semiconductor device according to claim 8, wherein the resistance switching layer is directly formed on the bottom electrode, and the barrier layer surrounds a bottom surface and parts of the sidewalls of the bottom electrode.

10. The semiconductor device according to claim 9, wherein the uppermost surface of the barrier layer and a top surface of the bottom electrode are spaced apart by the distance.

11. The semiconductor device according to claim 8, further comprising:
    an interlayer dielectric (ILD) layer, disposed on the substrate; and
    a conductive contact, disposed within the ILD layer and functioning as the bottom electrode,
    wherein the barrier layer is disposed at sidewalls of the conductive contact.

12. The semiconductor device according to claim 11, wherein the resistance switching layer is formed within the ILD layer and directly disposed on the conductive contact, and the uppermost surface of the barrier layer and a top surface of the conductive contact are spaced apart by the distance.

13. The semiconductor device according to claim 11, wherein the barrier layer is formed within the ILD layer, and the uppermost surface of the barrier layer and a top surface of the conductive contact are below a top surface of the ILD layer.

* * * * *